(12) United States Patent
Hsu et al.

(10) Patent No.: US 11,646,349 B2
(45) Date of Patent: May 9, 2023

(54) STRUCTURE OF SEMICONDUCTOR DEVICE

(71) Applicant: United Microelectronics Corp., Hsinchu (TW)

(72) Inventors: Chia-Jung Hsu, Tainan (TW); Chin-Hung Chen, Tainan (TW); Chun-Ya Chiu, Tainan (TW); Chih-Kai Hsu, Tainan (TW); Ssu-I Fu, Kaohsiung (TW); Tsai-Yu Wen, Tainan (TW); Shi You Liu, Kaohsiung (TW); Yu-Hsiang Lin, New Taipei (TW)

(73) Assignee: United Microelectronics Corp., Hsinchu (TW)

( * ) Notice: Subject to any disclaimer, the term of this patent is extended or adjusted under 35 U.S.C. 154(b) by 71 days.

(21) Appl. No.: 17/511,579

(22) Filed: Oct. 27, 2021

(65) Prior Publication Data
US 2022/0093741 A1 Mar. 24, 2022

Related U.S. Application Data

(62) Division of application No. 17/026,062, filed on Sep. 18, 2020, now Pat. No. 11,195,918.

(51) Int. Cl.
*H01L 29/10* (2006.01)
*H01L 21/265* (2006.01)
*H01L 29/167* (2006.01)
*H01L 29/06* (2006.01)

(52) U.S. Cl.
CPC ...... *H01L 29/105* (2013.01); *H01L 21/26506* (2013.01); *H01L 29/0649* (2013.01); *H01L 29/167* (2013.01)

(58) Field of Classification Search
CPC ............. H01L 29/105; H01L 21/26506; H01L 29/167; H01L 29/0649; H01L 21/823807
USPC .......................... 257/288, 285; 438/197, 217
See application file for complete search history.

(56) References Cited

U.S. PATENT DOCUMENTS

| 8,846,510 | B2 | 9/2014 | Chuang et al. | |
| 2006/0197158 | A1* | 9/2006 | Babcock et al. | .. H01L 21/26506 257/351 |
| 2010/0289088 | A1 | 11/2010 | Li et al. | |
| 2013/0240957 | A1 | 9/2013 | Lee et al. | |

* cited by examiner

*Primary Examiner* — Thinh T Nguyen
(74) *Attorney, Agent, or Firm* — JCIPRNET

(57) ABSTRACT

A structure of semiconductor device is provided, including a substrate. First and second trench isolations are disposed in the substrate. A height of a portion of the substrate is between a top and a bottom of the first and second trench isolations. A gate insulation layer is disposed on the portion of the substrate between the first and second trench isolations. A first germanium (Ge) doped layer region is disposed in the portion of the substrate just under the gate insulation layer. A second Ge doped layer region is in the portion of the substrate, overlapping with the first Ge doped layer region to form a Ge gradient from high to low along a depth direction under the gate insulation layer. A fluorine (F) doped layer region is in the portion of the substrate, lower than and overlapping with the first germanium doped layer region.

7 Claims, 6 Drawing Sheets

US 11,646,349 B2

STRUCTURE OF SEMICONDUCTOR DEVICE

CROSS-REFERENCE TO RELATED APPLICATION

This application is a divisional application of and claims the priority benefit of U.S. patent application Ser. No. 17/026,062, filed on Sep. 18, 2020, now allowed. The entirety of the above-mentioned patent application is hereby incorporated by reference herein and made a part of this specification.

BACKGROUND OF THE INVENTION

Field of the Invention

The invention relates to semiconductor fabrication technology, and particularly related to a structure of semiconductor device.

Description of Related Art

As the development of the various functions of electronic products, the control circuit may need to drive the high-voltage (HV) devices as operated in high-voltage level and the low-voltage (LV) devices as operated in low-voltage level. As to the operation of HV device and the LV device, the power module in an example needs to provide the HV power source and the LV power source. The HV circuit as operated at the HV level would involve the HV transistors for perform various function.

The HV transistor in the HV integrated circuit is the essential part. Various designs for the HV transistors have been provided in the market. The conventional HV transistor may still be based on the silicon as the channel in operation. However, the HV transistor based on the Ge-implanted channel is also proposed to improve operation efficiency.

However, the interface between the HV gate insulation layer and the HV channel with Ge implantation may suffer the dislocation of silicon when the HV gate oxide layer is formed. This dislocation of silicon may cause the defects of the HV transistor based on Ge channel. How to further design the HV transistor based on Ge-doped channel to reduce the Si dislocation is still at least an issue to solve in development.

SUMMARY OF THE INVENTION

The invention provides HV transistor with Ge-implanted channel, in which the silicon interface surface between the HV gate oxide layer and the channel with Ge implanted may have better quality with reaction of silicon dislocation. The quality of the channel may be improved.

In an embodiment, the invention provides a structure of semiconductor device, including a substrate. A first trench isolation and a second trench isolation are disposed in the substrate, wherein a height of a portion of the substrate is between a top and a bottom of the first and second trench isolations. A gate insulation layer is disposed on the portion of the substrate between the first and second trench isolations. A first Ge doped layer region is in the portion of the substrate just under the gate insulation layer. A second Ge doped layer region is in the portion of the substrate, overlapping with the first Ge doped layer region to form a Ge gradient from high to low along a depth direction under the gate insulation layer. A fluorine (F) doped layer region in the portion of the substrate, lower than and overlapping with the first germanium doped layer region.

In an embodiment, as to the structure of semiconductor device, a compensation fluorine doped layer region in the portion of the substrate, lower than and overlapping with the fluorine doped layer region.

In an embodiment, as to the structure of semiconductor device, the first Ge doped layer region has a Ge doped concentration distribution in depth with a Ge peak at a first depth. The fluorine doped layer region has a first F doped concentration distribution in depth with a first F peak at a second depth. The compensation fluorine doped layer region has a second F doped concentration distribution in depth with a second F peak at a third depth. The second depth is lower than the first depth and the third depth is lower than the second depth.

In an embodiment, as to the structure of semiconductor device, the second depth is lower than the first depth by 2.5 to 3.5 standard deviations from the first depth and the third depth is lower than the second depth by 0.8 to 1.2 standard deviations from the second depth.

In an embodiment, as to the structure of semiconductor device, a concentration for the F doped layer region is larger than a concentration for the compensation F doped layer region.

In an embodiment, as to the structure of semiconductor device, a concentration for the F doped layer region is same as a concentration for the compensation F doped layer region.

In an embodiment, as to the structure of semiconductor device, a bottom of the gate insulation layer is close to a concentration peak of the Ge doped layer region with a preset range.

BRIEF DESCRIPTION OF THE DRAWINGS

In order to make the aforementioned and other objectives and advantages of the present invention comprehensible, embodiments accompanied with figures are described in detail below.

DESCRIPTION OF THE EMBODIMENTS

The invention is directed to a semiconductor device of HV transistor, in which the channel of the HV transistor has been doped with Ge and the gate insulation layer is disposed on the channel. The quality of the interface between the channel doped with Ge and the gate insulation layer may be improved, in which Si dislocation at eth interface may be at least effectively reduced.

Multiple embodiments are provided for describing the invention but the invention is not just limited to the embodiments as provided. Further, a combination between the embodiments may also be taken.

Figure 1A:
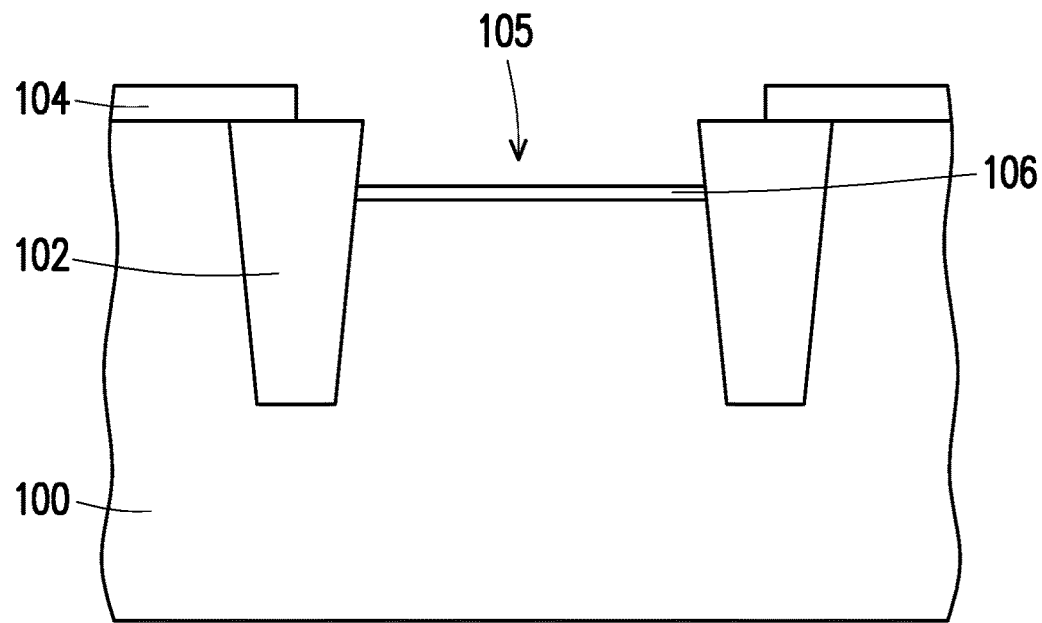
FIG. 1A to FIG. 1E are drawings, schematically illustrating a method for fabricating a semiconductor device, according to an embodiment of the invention.

FIG. 1A to FIG. 1E are drawings, schematically illustrating a method for fabricating a semiconductor device, according to an embodiment of the invention. Referring to FIG. 1A, a preliminary structure for forming a HV transistor has been fabricated on a substrate 100. In an embodiment, two trench isolations 102 are formed in the substrate 100 to define a region between the two trench isolations 102 as preserved to subsequently form a channel in the substrate 100 and HV gate insulation layer, such as HV gate oxide layer, on the channel. In fabrication, a mask layer 104 is formed on over the substrate but exposes the region between the two trench isolations 102. The substrate 100 in this region is etched to have a recess 105 with respect to the trench isolations 102. The surface of the substrate 100 in the recess 105 is lower than the two trench isolations 102 by a predetermined depth. To protect the surface of the substrate 100 at this region of the recess 105 as preserved to form the channel with Ge implantation, a sacrificial oxide layer 106 is also formed on the substrate 100 within the recess 105.

Figure 1B:
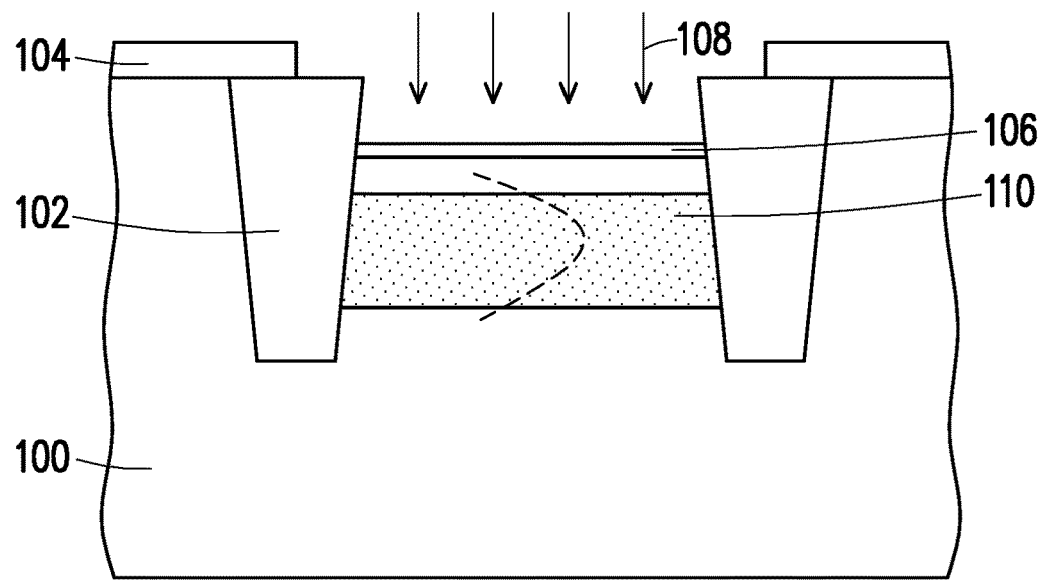

Referring to FIG. 1B, a Ge implantation 108 is performed to form a Ge doped layer region 110 in the substrate below the recess 105. As noted, the Ge doped layer region 110 has a Ge doped concentration distribution in depth with a Ge peak at a first depth, which is corresponding to the target depth for the implantation. The concentration distribution in an embodiment may be like a standard or Gaussian distribution with a peak.

As to fabricate the HV transistor, the channel of the HV transistor would be formed within the Ge doped layer region 110. A HV gate insulation layer is by thermal oxidation in an example to be a HV gate oxide layer, filling the recess 105 in later process. However, as looked into by the invention for forming the HV gate oxide layer on the substrate within the recess 105 at this condition, the interface between the substrate such as silicon substrate and the HV gate oxide layer may have silicon dislocation. This silicon dislocation would reduce the quality of the channel and then the performance of the HV transistor would be reduced accordingly.

To effectively reduce the dislocation at the substrate surface in an example, additional implantations as proposed in the invention may be performed into the channel region. The dislocation may be effectively reduced.

Figure 1C:
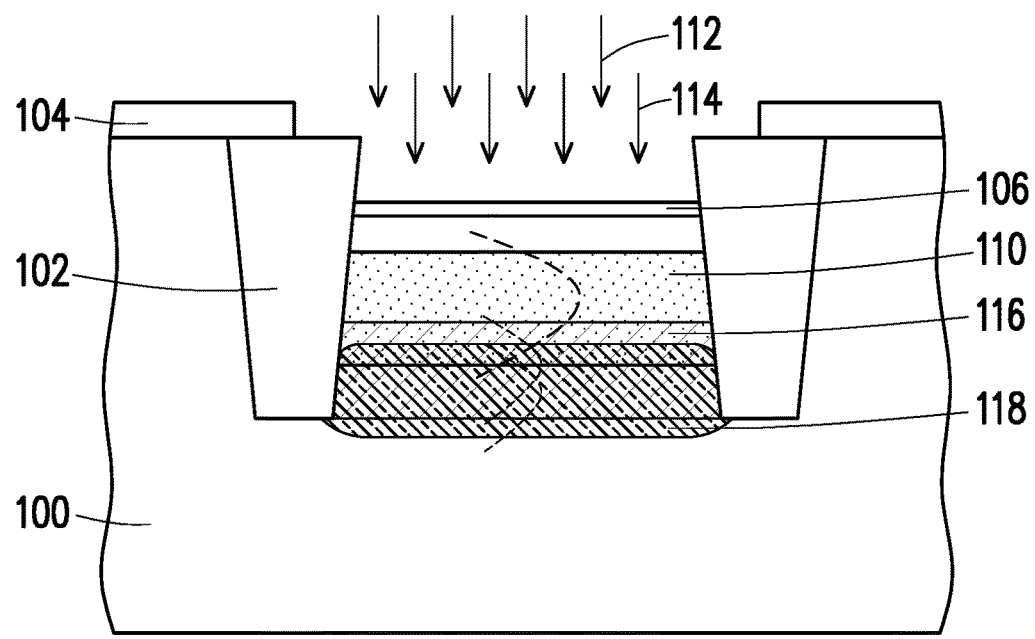

Referring to FIG. 1C, the additional implantation in an embodiment may include a fluorine implantation 112 to dope fluorine into the substrate as a fluorine doped layer region 116. The fluorine doped layer region 116 is lower than the Ge doped layer region 110 in depth.

In an embodiment, the fluorine doped layer region 116 has a first F doped concentration distribution in depth with a first F peak at a second depth. In an embodiment, the second depth of the first F peak of the fluorine doped layer region 116 is lower than the first depth of the Ge peak of the Ge doped layer region 110 by 2.5 to 3.5 standard deviations from the first depth. The fluorine dopants may modify the Ge dopant in grain structure. As a result, when the HV gate oxide layer is formed later by rapid thermal oxidation (RTO) in an example to form the HV channel, the silicon dislocation may be reduced.

In addition, a compensation fluorine implantation 114 may be further performed to form a compensation fluorine doped layer region 118 in the substrate 100 lower than the fluorine doped layer region 116. In other words, the compensation fluorine doped layer region 118 has another F doped concentration distribution in depth with another F peak at a third depth. In an embodiment, the third depth is lower than the second depth of the F peak of the fluorine doped layer region 116 by 0.8 to 1.2 standard deviations from the second depth.

Figure 1D:
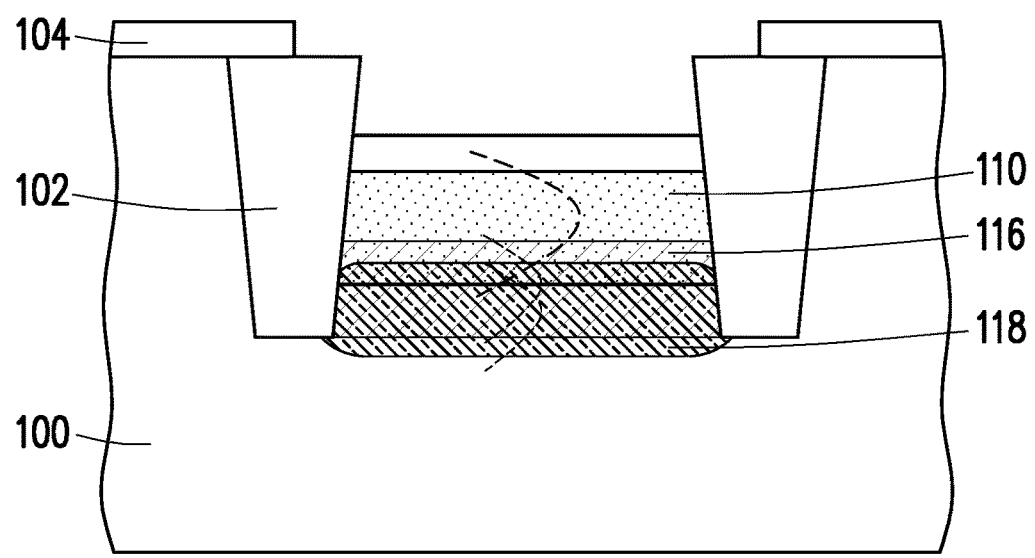
Figure 1E:
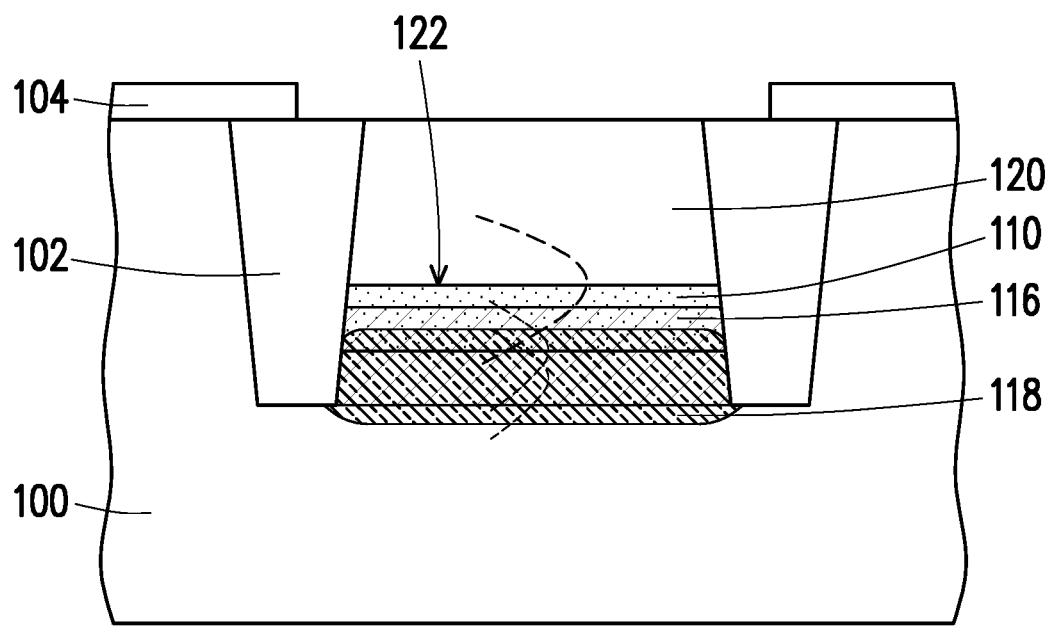

Referring to FIG. 1D, the sacrificial oxide layer 106 is removed. Referring to FIG. 1E, a HV gate insulation layer 120 is formed by performed thermal oxidation on the substrate with the recess 105 between the two trench isolations 102. The concentration distributions in dashed lines remaining in the drawing are just for reference only.

The substrate 100 in an embodiment is silicon, which is oxidized to form the HV gate insulation layer 120, which is sufficient thick to insulate the gate at the HV operation. The HV gate insulation layer 120 extends into the Ge doped layer region 110, which also based on the silicon substrate with the interface 122 to the substrate 100. In an embodiment, a bottom of the gate insulation layer is close to and lower than a concentration peak of the Ge doped layer region with a preset range. In an embodiment, a bottom of the gate insulation layer is close to and also lower than a concentration peak of the Ge doped layer region with a preset range to have concentration gradient. The HV channel is in the GE doped region under the interface 122. The silicon dislocation at the interface 122 portion may be reduced due to the additional F implantation. As observed in the sample product, the silicon dislocation indeed is reduced.

Based on the aspect in FIG. 1A to FIG. 1E, a further modification may be taken in an embodiment. FIG. 2A to FIG. 2E are drawings, schematically illustrating a method for fabricating a semiconductor device, according to an embodiment of the invention.

Figure 2A:
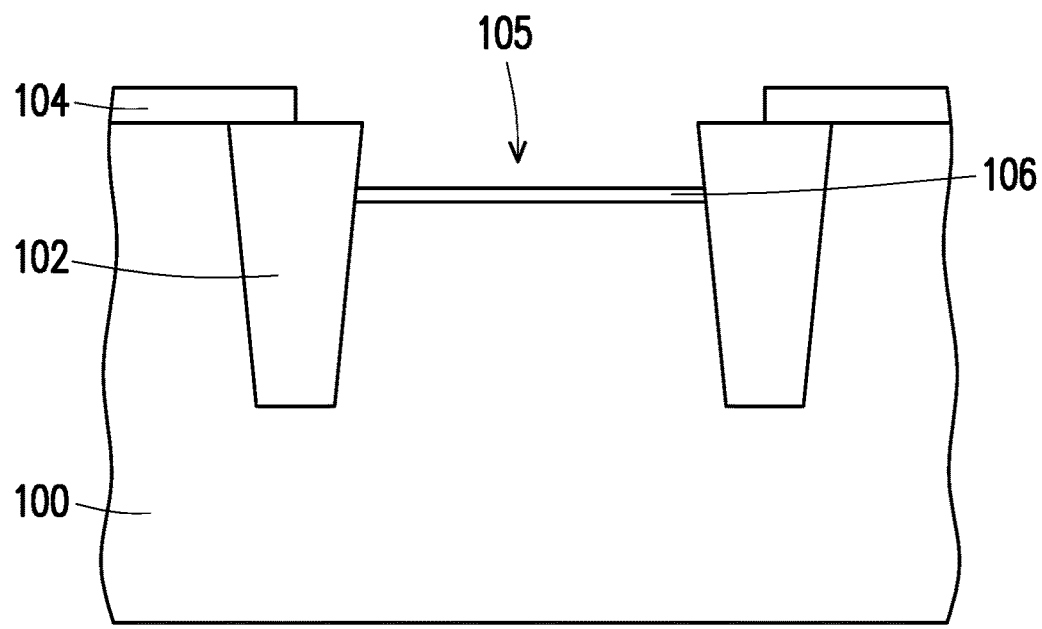
FIG. 2A to FIG. 2E are drawings, schematically illustrating a method for fabricating a semiconductor device, according to an embodiment of the invention.

Referring to FIG. 2A, it is the same structure as FIG. 1A. The descriptions are omitted here. The structure in FIG. 2A has been preliminarily fabricated for the subsequent fabrication.

Figure 2B:
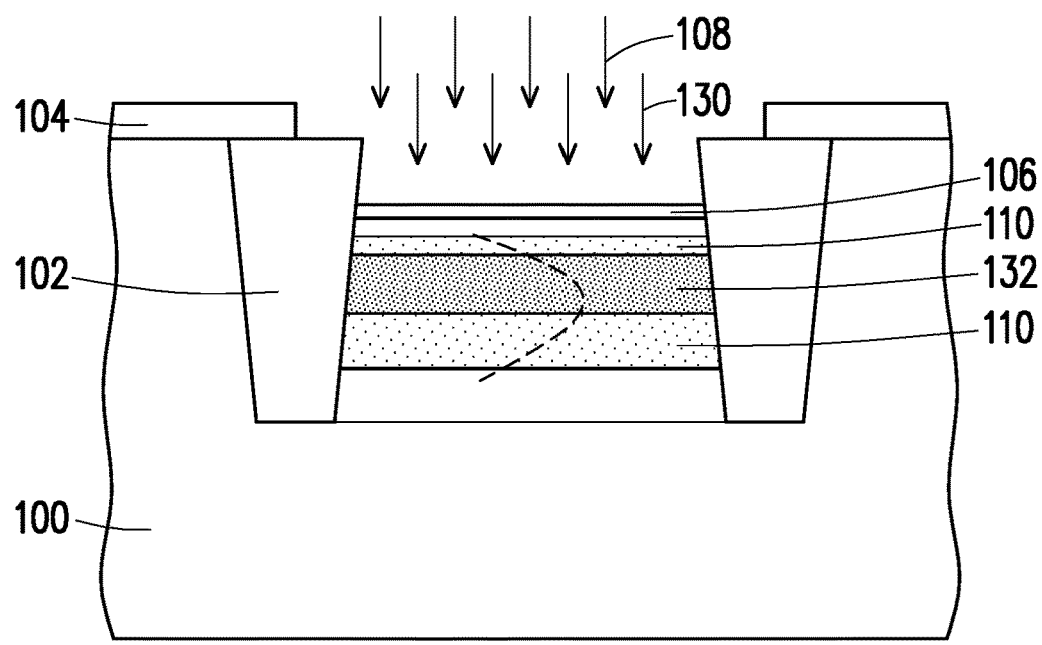

Referring to FIG. 2B, a Ge implantation 108 is performed to form a Ge doped layer region 110 in the substrate below the recess 105. As noted, the Ge doped layer region 110 has a Ge doped concentration distribution in depth with a Ge peak at a first depth, which is corresponding to the target depth for the implantation. The concentration distribution in an embodiment may be like a standard or Gaussian distribution with a peak. The Ge implantation 108 may be the same as described in FIG. 1B.

Further, in the embodiment, another Ge implantation 130 may be further included. The Ge implantation 130 forms another Ge doped layer region 132 in the substrate. The Ge doped layer region 132 is fully overlapped within the Ge doped layer region 112 with narrower distribution, in an embodiment. The Ge concentration in the Ge doped layer region 132 may produce the concentration gradient when the channel under the HV gate insulation layer is actually formed.

Likewise, to effectively reduce the dislocation at the substrate surface in an example, additional implantations as proposed in the invention may be performed into the channel region. The dislocation may be effectively reduced.

Figure 2C:
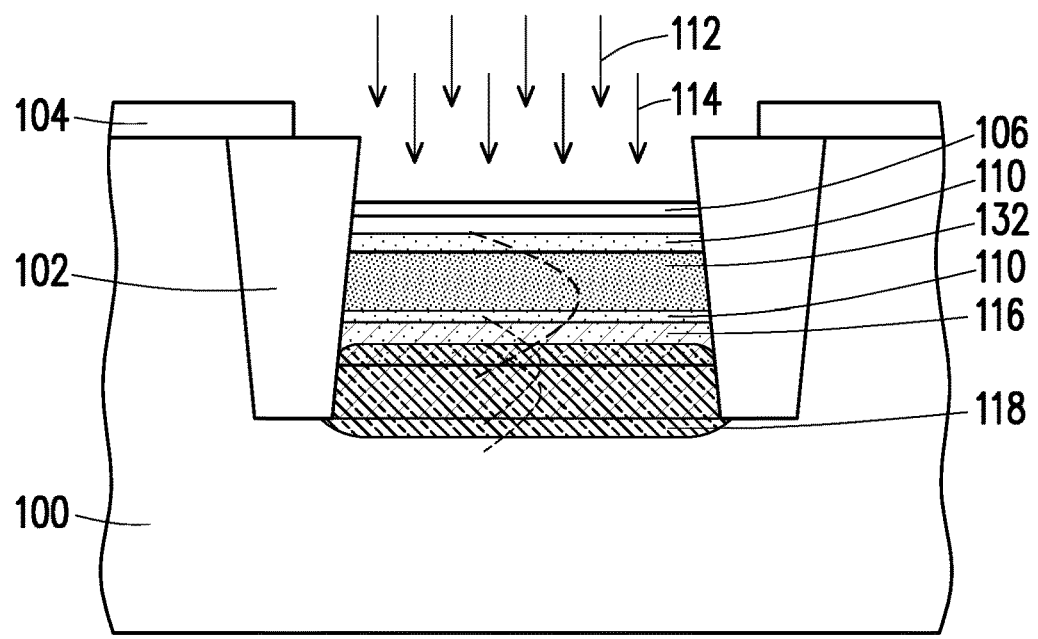

Referring to FIG. 2C, it is similar to FIG. 1C, the additional implantation in an embodiment may include a fluorine implantation 112 to dope fluorine into the substrate as a fluorine doped layer region 116. The fluorine doped layer region 116 is lower than the Ge doped layer region 110 in depth.

In an embodiment, the fluorine doped layer region 116 has a first F doped concentration distribution in depth with a first F peak at a second depth. In an embodiment, the second depth of the first F peak of the fluorine doped layer region 116 is lower than the first depth of the Ge peak of the Ge doped layer region 110 by 2.5 to 3.5 standard deviations from the first depth. The fluorine dopants may modify the Ge dopant in grain structure. As a result, when the HV gate oxide layer is formed later by rapid thermal oxidation (RTO) in an example to form the HV channel, the silicon dislocation may be reduced.

In addition, a compensation fluorine implantation 114 may be further performed to form a compensation fluorine doped layer region 118 in the substrate 100 lower than the fluorine doped layer region 116. In other words, the compensation fluorine doped layer region 118 has another F doped concentration distribution in depth with another F peak at a third depth. In an embodiment, the third depth is lower than the second depth of the F peak of the fluorine doped layer region 116 by 0.8 to 1.2 standard deviations from the second depth.

Figure 2D:
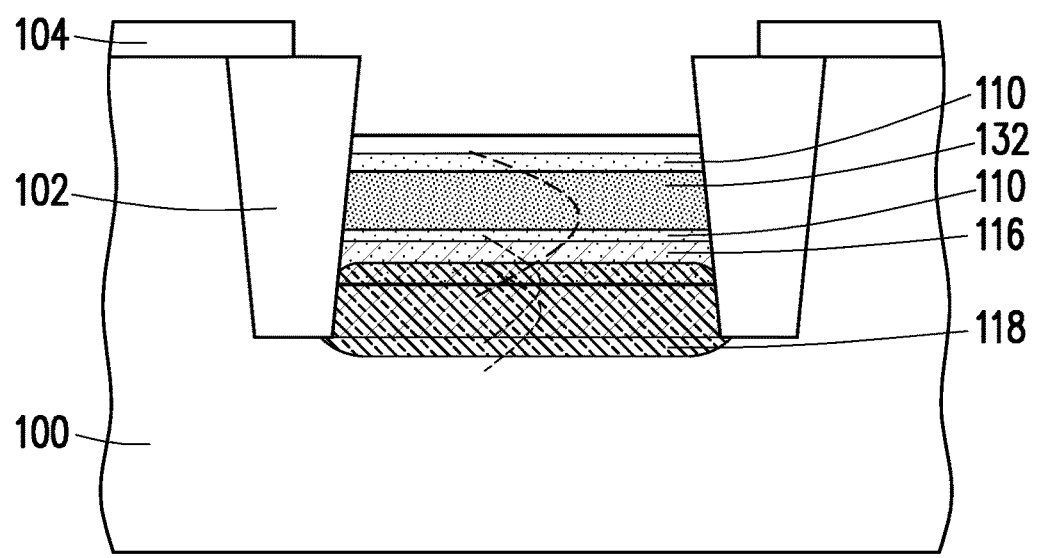
Figure 2E:
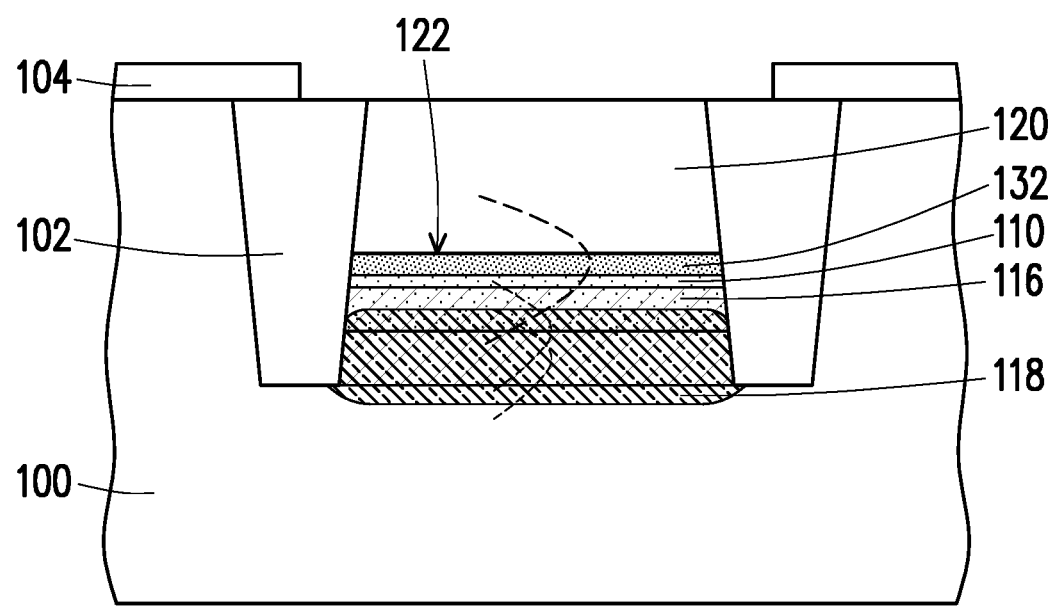

Referring to FIG. 2D, the sacrificial oxide layer 106 is removed. Referring to FIG. 2E, a HV gate insulation layer 120 is formed by performed thermal oxidation on the substrate with the recess 105 between the two trench isolations 102. The concentration distributions in dashed lines remaining in the drawing are just for reference only.

The substrate 100 in an embodiment is silicon, which is oxidized to form the HV gate insulation layer 120, which is sufficient thick to insulate the gate at the HV operation. The HV gate insulation layer 120 extends into the Ge doped layer region 110, which also based on the silicon substrate with the interface 122 to the substrate 100. The HV channel is in the GE doped region under the interface 122. The silicon dislocation at the interface 122 portion may be reduced due to the additional F implantation. As observed in the sample product, the silicon dislocation indeed is reduced.

In addition, the HV gate insulation layer 120 needs to be sufficiently thick. The thermal oxidation causes the silicon material of the substrate 100 to be oxidized as well and the bottom of the HV gate insulation layer 120 would reach to the Ge doped layer region 110 and is below the Ge peak. In an embodiment, a bottom of the gate insulation layer is close to or even lower than a concentration peak of the Ge doped layer region 100 with a preset range. The concentration gradient for the channel is determined by the concentration distribution.

In the embodiment, the Ge doped layer region 132 in FIG. 2C is additionally formed to overlap with the Ge doped layer region 110 at the upper part. When the HV gate insulation layer 120 is formed, the concentration gradient for the channel may be further improved to enhance the performance of the HV channel.

As to the foregoing descriptions, the Ge implantation may be performed in one stage referring to FIG. 1B or two stages referring to FIG. 2B, to produce the concentration gradient for the HV channel. In addition, the fluorine implantation may be one stage or two stages, so that the dislocation of the substrate mater under thermal oxidation process may be effectively reduced.

Although the invention is described with reference to the above embodiments, the embodiments are not intended to limit the invention. A person of ordinary skill in the art may make variations and modifications without departing from the spirit and scope of the invention. Therefore, the protection scope of the invention should be subject to the appended claims.

What is claimed is:

1. A structure of semiconductor device, comprising:
a substrate;
a first trench isolation and a second trench isolation, disposed in the substrate, wherein a height of a portion of the substrate is between a top and a bottom of the first and second trench isolations;
a gate insulation layer, disposed on the portion of the substrate between the first and second trench isolations;
a first germanium (Ge) doped layer region in the portion of the substrate just under the gate insulation layer;
a second Ge doped layer region in the portion of the substrate, overlapping with the first Ge doped layer region to form a Ge gradient from high to low along a depth direction under the gate insulation layer; and
a fluorine (F) doped layer region in the portion of the substrate, lower than and overlapping with the first germanium doped layer region.

2. The structure of semiconductor device of claim 1, wherein a compensation fluorine doped layer region in the portion of the substrate, lower than and overlapping with the fluorine doped layer region.

3. The structure of semiconductor device of claim 2, wherein
the first Ge doped layer region has a Ge doped concentration distribution in depth with a Ge peak at a first depth,
the fluorine doped layer region has a first F doped concentration distribution in depth with a first F peak at a second depth, and
the compensation fluorine doped layer region has a second F doped concentration distribution in depth with a second F peak at a third depth,
wherein the second depth is lower than the first depth and the third depth is lower than the second depth.

4. The structure of semiconductor device of claim 3, wherein the second depth is lower than the first depth by 2.5 to 3.5 standard deviations from the first depth and the third depth is lower than the second depth by 0.8 to 1.2 standard deviations from the second depth.

5. The structure of semiconductor device of claim 2, wherein a concentration for the F doped layer region is larger than a concentration for the compensation F doped layer region.

6. The structure of semiconductor device of claim 2, wherein a concentration for the F doped layer region is same as a concentration for the compensation F doped layer region.

7. The structure of semiconductor device of claim 1, wherein a bottom of the gate insulation layer is close to a concentration peak of the Ge doped layer region with a preset range.

* * * * *